United States Patent
Zhang et al.

(10) Patent No.: US 12,356,809 B2
(45) Date of Patent: Jul. 8, 2025

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Meng Zhang, Beijing (CN); Tinghua Shang, Beijing (CN); Linhong Han, Beijing (CN); Lulu Yang, Beijing (CN); Yi Qu, Beijing (CN); Xin Zhang, Beijing (CN); Yupeng He, Beijing (CN); Huijun Li, Beijing (CN); Xiaofeng Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 1120 days.

(21) Appl. No.: 17/263,576

(22) PCT Filed: Apr. 14, 2020

(86) PCT No.: PCT/CN2020/084713
§ 371 (c)(1),
(2) Date: Jan. 27, 2021

(87) PCT Pub. No.: WO2021/207930
PCT Pub. Date: Oct. 21, 2021

(65) Prior Publication Data
US 2022/0199733 A1    Jun. 23, 2022

(51) Int. Cl.
*H10K 59/35* (2023.01)
*H10K 59/131* (2023.01)
*H10K 59/88* (2023.01)

(52) U.S. Cl.
CPC ......... *H10K 59/131* (2023.02); *H10K 59/353* (2023.02); *H10K 59/88* (2023.02)

(58) Field of Classification Search
CPC ........ H10K 59/00; H10K 59/12; H10K 59/18; H10K 59/35; H10K 59/38; H10K 59/122;
(Continued)

(56) References Cited

U.S. PATENT DOCUMENTS 10,170,534 B1    1/2019    Kim et al.
2007/0035687 A1    2/2007    Oke et al.
(Continued)

FOREIGN PATENT DOCUMENTS

CN    1912721 A    2/2007
CN    109509771 A    3/2019
(Continued)

OTHER PUBLICATIONS

Extended European search report of counterpart European application No. 20931099.4 issued on May 8, 2023.

*Primary Examiner* — Chuong A Luu
(74) *Attorney, Agent, or Firm* — Lippes Mathias LLP

(57) ABSTRACT

A display substrate includes: a base substrate including a display region and a non-display region surrounding the display region; a plurality of sub-pixels in the display region; a plurality of power lines in the display region, the plurality of power lines extending along a first direction, and being electrically connected to the plurality of sub-pixels and being configured to provide power signals for the plurality of sub-pixels; a plurality of dummy sub-pixels in the non-display region on one side of the display region along the first direction; and a plurality of dummy power lines in the non-display region, the plurality of dummy power lines extending along the first direction, the plurality
(Continued)

of dummy power lines and the plurality of dummy subpixels being on the same side of the display region.

17 Claims, 13 Drawing Sheets

(58) Field of Classification Search
CPC .... H10K 59/131; H10K 59/88; H10K 59/353; H10K 59/352; H10K 59/65; H10K 59/124; H10K 59/126; H10K 59/173; H10K 59/878; H10K 59/879; H10K 59/873; H10K 59/1201; H10K 59/1213; H10K 59/8731; H10K 59/8791; H10K 59/8792; G09G 2330/06; G09G 2330/0426; G09G 2330/0413; G09G 3/3208
USPC .......................................................... 257/40
See application file for complete search history.

(56) References Cited

U.S. PATENT DOCUMENTS

| | | | |
|---|---|---|---|
| 2011/0083881 A1* | 4/2011 | Nguyen | H05K 3/108 |
| | | | 29/829 |
| 2014/0346475 A1* | 11/2014 | Cho | G09G 3/3225 |
| | | | 438/4 |
| 2016/0300533 A1* | 10/2016 | Lee | G09G 3/3266 |
| 2016/0372535 A1 | 12/2016 | Lee et al. | |
| 2018/0342572 A1 | 11/2018 | Park et al. | |

FOREIGN PATENT DOCUMENTS

| | | |
|---|---|---|
| EP | 2787499 A1 | 10/2014 |
| EP | 2806458 A2 | 11/2014 |
| EP | 3093836 A1 | 11/2016 |

* cited by examiner

# DISPLAY SUBSTRATE AND DISPLAY DEVICE

CROSS-REFERENCE TO RELATED APPLICATION

The present application is a 371 of PCT Application No. PCT/CN2020/084713, filed on Apr. 14, 2020, the content of which is incorporated herein by reference.

TECHNICAL FIELD

The present disclosure relates to the field of display technologies, and in particular, to a display substrate and a display device.

BACKGROUND

Compared with traditional liquid crystal displays (LCD), active matrix organic light-emitting diode (AMOLED) displays have the advantages of self-illumination, wide color gamut, high contrast, lightness, thinness and the like. Therefore, such AMOLED displays are widely used in the field of mobile phones, tablet computers and the like, and also widely used in the field of flexible wearable devices such as smart watches.

SUMMARY

Embodiments of the present disclosure provide a display substrate and a display device.

In one aspect, a display substrate is provided. The display substrate includes:

a base substrate including a display region and a non-display region surrounding the display region;

a plurality of sub-pixels in the display region;

a plurality of power lines in the display region, wherein the plurality of power lines extend along a first direction, and are electrically connected to the plurality of sub-pixels and configured to provide power signals for the plurality of sub-pixels;

a plurality of dummy sub-pixels in the non-display region on one side of the display region along the first direction; and a plurality of dummy power lines in the non-display region, wherein the plurality of dummy power lines extend along the first direction, the plurality of dummy power lines and the plurality of dummy sub-pixels are on the same side of the display region, and at least part of the plurality of power lines are electrically connected to at least part of the plurality of dummy power lines.

Optionally, the at least part of the plurality of power lines and the at least part of the plurality of dummy power lines are connected in one-to-one correspondence.

Optionally, the display substrate further includes at least one first power connection line in the non-display region, wherein the at least one first power connection line is between the plurality of power lines and the plurality of dummy power lines and extends along the first direction, and is electrically connected to at least one of the plurality of power lines and at least one of the plurality of dummy power lines.

Optionally, the display substrate further includes a plurality of first power connection lines connected to the plurality of power lines and the plurality of dummy power lines in one-to-one correspondence.

Optionally, the display substrate further includes at least one second power connection line extending in a second direction, wherein the first direction intersects with the second direction, and the plurality of first power connection lines at least partially are overlapped with and are electrically connected to the at least one second power connection line.

Optionally, the number of the at least one second power connection line is one, or the number of the at least one second power connection line is more than one, and the plurality of second power connection lines are parallel to each other.

Optionally, the display substrate includes one second power connection line, wherein a width of the second power connection line ranges from 20 microns to 30 microns in a direction perpendicular to the second direction.

Optionally, the second power connection line and the first power connection line are on the same layer.

Optionally, the display substrate further includes a plurality of pattern blocks in the non-display region, wherein the plurality of pattern blocks are spaced apart from each other around the display region.

Optionally, orthographic projections of the first power connection line and the second power connection line on the base substrate are not overlapped with an orthographic projection of the pattern block on the base substrate.

Optionally, the display substrate further includes a plurality of dummy data lines in the non-display region, wherein the plurality of dummy data lines extend along the first direction, and the plurality of dummy data lines are electrically connected to the plurality of dummy power lines.

Optionally, the plurality of dummy data lines and the plurality of dummy power lines are electrically connected in one-to-one correspondence.

Optionally, one of the dummy data lines and one of the dummy power lines are electrically connected by a plurality of electrical contacts, wherein the plurality of electrical contacts are in one-to-one correspondence with the plurality of dummy sub-pixels.

Optionally, the dummy sub-pixel includes a dummy active layer on the base substrate, a first dummy gate layer on a side of the dummy active layer distal from the base substrate, and a second dummy gate layer on a side of the first dummy gate layer distal from the base substrate, wherein the dummy power line is on a side of the second dummy gate layer distal from the base substrate; and the dummy power line is electrically connected to at least one of the dummy active layer, the first dummy gate layer, and the second dummy gate layer.

Optionally, the dummy power line is electrically connected to the dummy active layer, the first dummy gate layer, and the second dummy gate layer respectively.

Optionally, the dummy sub-pixel further includes a first dummy gate insulation layer, a second dummy gate insulation layer, and a dummy interlayer insulation layer, wherein the first dummy gate insulation layer is between the dummy active layer and the first dummy gate layer, the second dummy gate insulation layer is between the first dummy gate layer and the second dummy gate layer, and the dummy interlayer insulation layer is between the second dummy gate layer and the dummy power line.

Optionally, the dummy sub-pixel further includes a first via running through the second dummy gate insulation layer and the dummy interlayer insulation layer, wherein the dummy power line is electrically connected to the first dummy gate layer by the first via.

Optionally, the dummy sub-pixel further includes a second via running through the first dummy gate insulation layer, wherein the second dummy gate insulation layer, and the dummy interlayer insulation layer, and the dummy power line is electrically connected to the dummy active layer by the second via.

Optionally, the dummy sub-pixel further includes a third via running through the dummy interlayer insulation layer, wherein the dummy power line is electrically connected to the second dummy gate layer by the third via.

Optionally, the dummy sub-pixel further includes a first dummy electrode, wherein the first dummy electrode is electrically connected to the dummy power line, and is electrically connected to the dummy active layer by the second via.

Optionally, the dummy sub-pixel further includes a second dummy electrode, wherein the second dummy electrode is electrically connected to the dummy power line, and electrically connected to the second dummy gate layer by the third via.

Optionally, the plurality of sub-pixels include an active layer on the base substrate, a gate layer on a side of the active layer distal from the base substrate, and a source-drain layer on a side of the gate layer distal from the base substrate; and the plurality of power lines, the plurality of dummy power lines, the first power connection line, and the second power connection line are on the same layer as the source-drain layer.

Optionally, the plurality of sub-pixels include an active layer on the base substrate, a gate layer on a side of the active layer distal from the base substrate, and a source-drain layer on a side of the gate layer distal from the base substrate;

wherein the plurality of pattern blocks are on the same layer as the active layer.

Optionally, the display substrate further includes a power bus in the non-display region on a side of the display region distal from the plurality of dummy sub-pixels, wherein the power bus is electrically connected to the plurality of power lines.

Optionally, the display substrate further includes a plurality of data lines in the display region, wherein the plurality of data lines extend along the first direction, and the plurality of data lines are insulated from the plurality of power lines.

In another aspect, a display device is provided. The display device includes any of the display substrates as described above.

BRIEF DESCRIPTION OF DRAWINGS

For clearer descriptions of the technical solutions in embodiments of the present disclosure the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

Embodiments of the present disclosure are described in further detail with reference to the accompanying drawings, to present the objects, technical solutions, and advantages of the present disclosure more clearly.

OLED display panels are categorized into passive matrix driving organic light-emitting diodes (PMOLED) display panels and AMOLED display panels according to driving modes. The solution provided by the present disclosure is mainly applied to the AMOLED display panels, which may be, for example, flexible AMOLED display panels.

An OLED is driven by a current and the display brightness of the OLED is proportional to the driving current. It can be seen from the formula of the driving current $I=K*(VDD-Vdata-|Vth|)^2$ (where K is a conductive factor of a transistor and Vth is a threshold voltage of the transistor) that: when a data voltage Vdata has a small change, the driving current I changes with the change of a power supply voltage VDD, such that the display brightness of the OLED is affected by the power supply voltage VDD.

In a normal display process, the voltage jump of other signals in a display region (region AA) may affect a VDD signal, causing slight disturbance of the VDD signal. The disturbance of the VDD signal causes the change of the display brightness of the OLED, and thus the display effect is affected.

Figure 1:
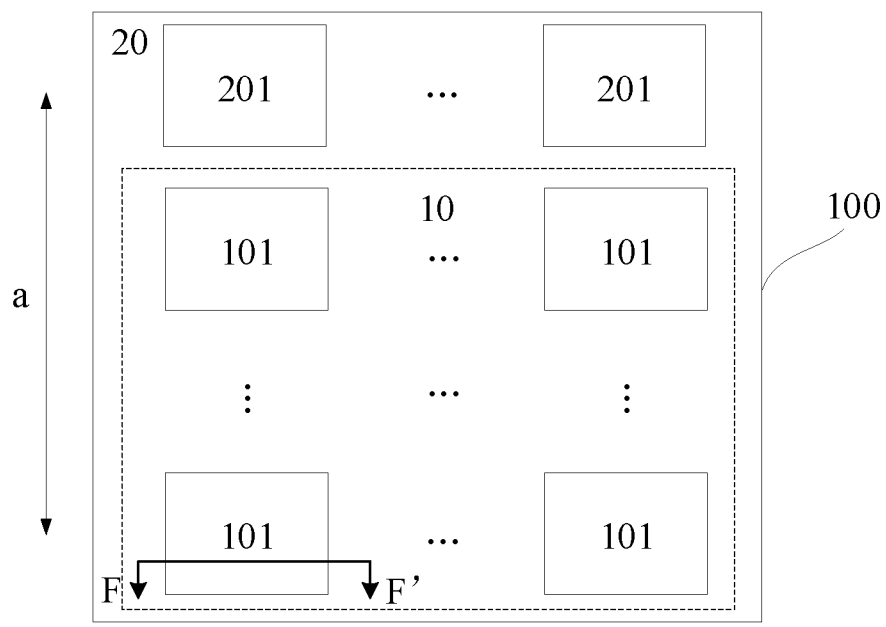
FIG. 1 is a structural diagram of a display substrate according to an embodiment of the present disclosure.

FIG. 1 is a structural diagram of a display substrate according to an embodiment of the present disclosure. With reference to FIG. 1, the display substrate includes:

a base substrate 100 including a display region 10 and a non-display region 20 surrounding the display region 10;

a plurality of sub-pixels 101 in the display region 10; and a plurality of dummy sub-pixels 201 in the non-display region 20 on one side of the display region 10 along the first direction a, that is, the plurality of dummy sub-pixels 201 and the display region 10 are sequentially arranged along the first direction.

Figure 2:
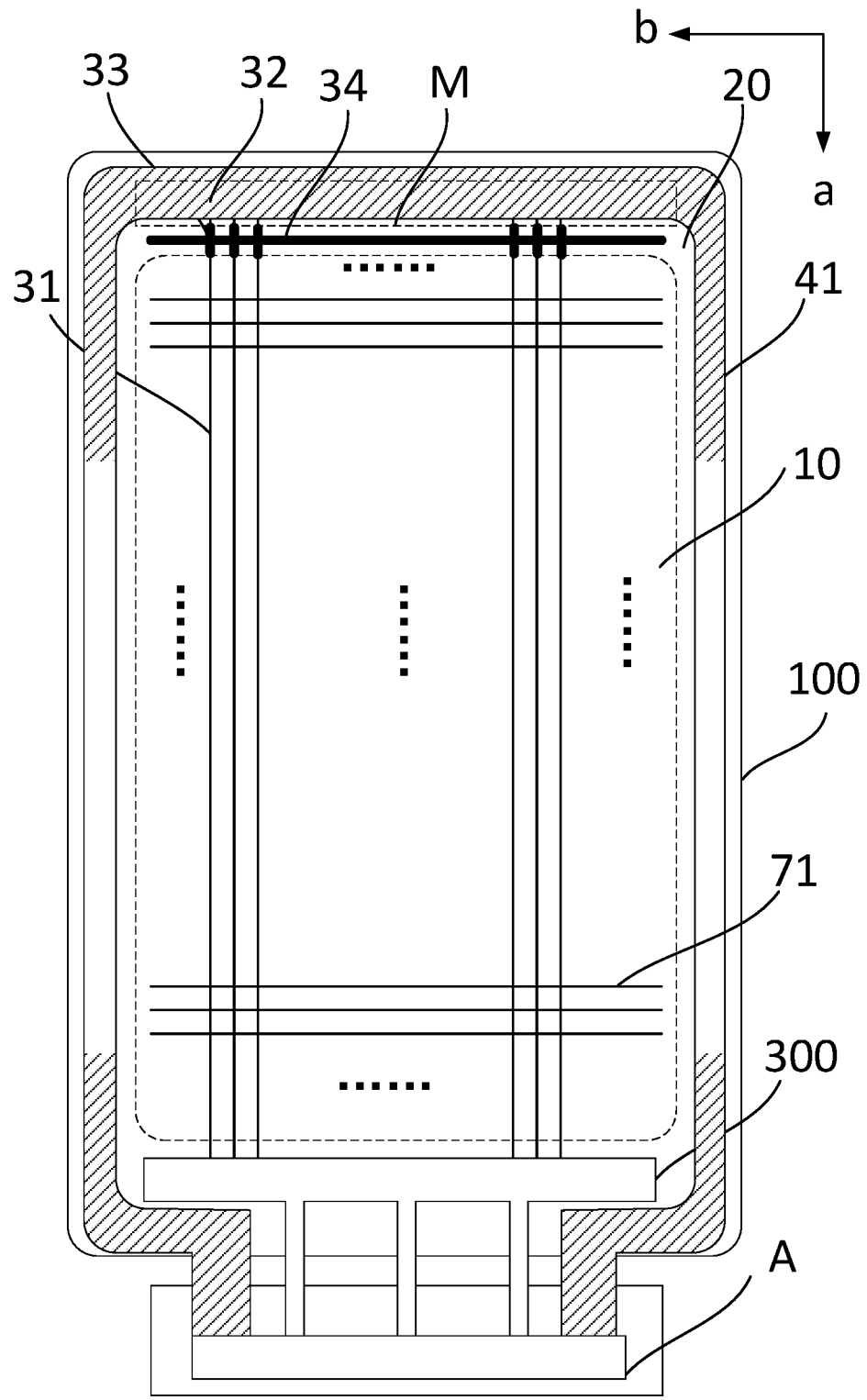
FIG. 2 is a structural diagram of the display substrate according to the embodiment of the present disclosure.

FIG. 2 is a structural diagram of the display substrate according to the embodiment of the present disclosure. With reference to FIG. 2, the display substrate further includes:

a plurality of power lines (VDD lines) 31 in the display region 10, wherein the plurality of power lines 31 extend along the first direction a, and are electrically connected to the plurality of sub-pixels 101 and configured to provide power signals for the plurality of sub-pixels 101; and a plurality of dummy power lines 32 in the non-display region 20, wherein the plurality of dummy power lines 32 extend along the first direction a, and the plurality of dummy power lines 32 and the plurality of dummy sub-pixels 201 are on the same side of the display region 10.

At least part of the plurality of power lines 31 are electrically connected to at least part of the plurality of dummy power lines 23.

A capacitor may be formed between the dummy power line of the dummy sub-pixel in the non-display region 20 and a common power line (VSS line) 41. In the related art, a gate high-level (VGH) signal is input into the dummy power line in the non-display region 20. Since the dummy power line and the power line are insulated from each other, this solution may not affect the signal of the power line, and thus shows no contribution to the display of the display region. In the embodiment of the present disclosure, by connecting the power line (such as a positive power line (VDD) in the display region 10 to the dummy power line in the non-display region 20, the capacitor can compensate for the jump of the power line in the display region 10 and increase the stability of the power line in the display region 10. Therefore, this solution can improve the brightness stability of the display panel.

Here, the plurality of dummy power lines 32 are at least partially overlapped with the plurality of dummy sub-pixels 201. That is, when the dummy power lines 32 are disposed along the first direction, the dummy power lines 32 run through the region where the dummy sub-pixels 201 are disposed and regions between adjacent dummy sub-pixels 201, such that each dummy powers line 32 are partially overlapped with the dummy sub-pixel 201. With this design, a relatively large overlapping capacitor is formed between the dummy power line 32 in the non-display region 20 and the VSS line, and the VSS line outputs a stable direct current signal. As a result, when the VSS line is used as one end of the capacitor, it can effectively suppress the voltage disturbance of the power line connected to the other end of the capacitor, thereby improving the voltage stability of the power line.

Exemplarily, the above power line 31 may be on a source-drain (SD) layer of the display substrate, the dummy power line 32 may be on a dummy source-drain layer of the display substrate, and the common power line (VSS) 41 may be double-layer wiring formed by the source-drain layer (and/or the dummy source-drain layer) and an anode layer (and/or a dummy anode layer) of the display substrate. In other embodiments, the common power line 41 may also be single-layer wiring formed by the anode layer (and/or the dummy anode layer). Here, the source-drain layer and the dummy source-drain layer are disposed on the same layer, the dummy source-drain layer is in the non-display region, and the source-drain layer is in the display region. The same applies to the anode layer and the dummy anode layer. An X layer and a dummy X layer later are disposed based on the above rules.

As shown in FIGS. 1 and 2, the middle of the display substrate is the display region 10, and a region of the display substrate excluding the display region 10 is the non-display region, also called a peripheral region. As shown in FIG. 1 and FIG. 2, part of the non-display region where the dummy sub-pixels are disposed is above the display region 10, i.e., a region indicated by a sign M in FIG. 2.

In the embodiment of the present disclosure, each of the non-display region 20 and the display region 10 includes sub-pixels. The sub-pixels in the display region 10 are normal sub-pixels and may emit light; and the sub-pixels in the non-display region 20 are dummy sub-pixels which do not emit light. The purpose of disposing the dummy sub-pixels is to ensure the uniformity of patterning in the display region, thereby ensuring the display effect of the display region. The dummy sub-pixels are not configured to emit light, in the related art, the dummy power line in the non-display region and the power line in the normal region are disconnected. However, in the present disclosure, the dummy power line in the non-display region and the power line in the normal region are connected, thereby solving the problem of the signal stability of the power line. Moreover, although the power lines are connected, the dummy sub-pixels still do not emit light as the dummy sub-pixels and still cannot obtain other signals, such as data signals.

In the embodiment of the present disclosure, at least part of the plurality of power lines 31 and at least part of the plurality of dummy power lines 32 are electrically connected in one-to-one correspondence. That is, not all power lines 31 are connected to the dummy power lines 32, and each power line 31 is only connected to one dummy power line 32, and each dummy power line 32 is also only connected to one power line 31. a connection mode of the power line 31 and the dummy power line 32 is described hereinafter with reference to FIG. 2.

As shown in FIG. 2, the display substrate further includes at least one first power connection line 33 in the non-display region 20. The at least one first power connection line 33 is between the plurality of power lines 31 and the plurality of dummy power lines 32 and extends along the first direction a, and is electrically connected to at least one of the plurality of power lines 31 and at least one of the plurality of dummy power lines 32.

Exemplarily, the display substrate includes a plurality of first power connection lines 33 connected to the plurality of power lines 31 and the plurality of dummy power lines 32 in one-to-one correspondence.

Exemplarily, the first power connection lines 33 may be disposed on the same layer as the power line 31. The same layer may mean that these lines are formed in a one-time patterning process, or may mean that these lines are on the same side of the same layer, or may mean that surfaces of these lines proximal to the base substrate are in contact with the same layer.

As shown in FIG. 2, the display substrate further includes a power bus 300 in the non-display region 20 on the other side of the display region 10. That is, the power bus 300 and the above dummy sub-pixels 201 are on two opposite sides of the display region 10. The power bus 300 is electrically connected to the plurality of power lines 31.

In the non-display region 20 below the display region 10, the power line 31 is connected to a flexible printed circuit (FPC) board (labeled A in the figure) by the power bus 300, and by the FPC, a signal is provided for the power line 31 of the display substrate for driving. It can be seen from FIG. 2 that in addition to providing a VDD signal for the display substrate, the FPC also provides a VSS signal and other signals for the display substrate.

Exemplarily, the power bus 300 may be disposed on the same layer as the power line 31.

Here, since the dummy sub-pixels 201 and the FPC are distributed on two opposite sides of the display region 10, an end where the dummy sub-pixels 201 are disposed may also be called an end of the display substrate away (remote) from the FPC. Generally, the stability of the VDD signal of the sub-pixels distal from the FPC end in the display region 10 is poor, and the display stability of the sub-pixels distal from the FPC end in the display region 10 is improved by the solution of the present disclosure.

As shown in FIG. 2, the display substrate further includes a gate line 71. The gate line 71 and the power line 31 are on different layers, and intersect with each other. For example, the gate line 71 and the power line 31 are vertically disposed.

During an operation process of the panel, a gate line signal may be written into the gate line 71.

Figure 3:
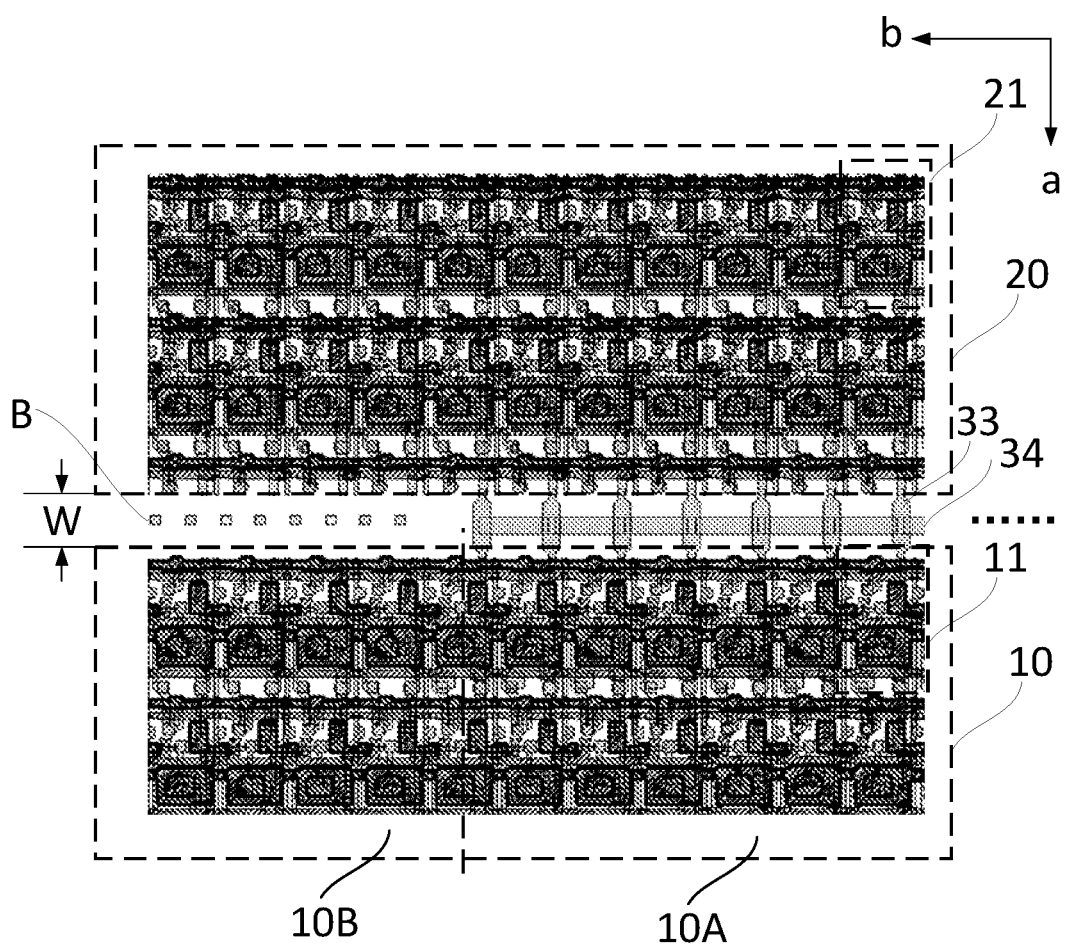
FIG. 3 is a partial structural diagram of the display substrate according to the embodiment of the present disclosure.

FIG. 3 is a partial structural diagram of the display substrate according to the embodiment of the present disclosure. With reference to FIG. 3, this portion may be an upper left corner of the display substrate. Usually, dummy sub-pixels are designed on the display substrate having rounded corners. In the display substrate having rounded corners, in addition to eliminating the problem of uneven patterning with the dummy sub-pixels, a plurality of pattern blocks in the non-display region 20 are also reserved. The plurality of pattern blocks are spaced apart from each other around the display region. For example, the pattern blocks are on a dummy active layer, a dummy source-drain layer and the like. A sign B in FIG. 3 represents the pattern block of the dummy active layer. Here, the pattern block B functions the same as the dummy sub-pixel 21 in the non-display region 20, both being for ensuring the uniformity of patterns of normal pixels 11 in the display region 10 by forming patterns on an edge portion. As in the case when the display substrate has rounded corners and the like, the pattern etched on the edge portion may be deviated, by designing the dummy sub-pixels and the pattern block B, which is equivalent to moving the edge outwards and then sacrificing the edge, the uniformity of patterns of the interior, i.e., the display region, is ensured.

As shown in FIG. 3, the power line in a middle region 10A of the display region 10 is connected to the dummy power line in the non-display region 20 by the first power connection line 33; and the power line in an edge region 10B of the display region 10 is not connected to the dummy power line in the non-display region 20. In a second direction b, the edge region 10B of the display region 10 is between the middle region 10A of the display region 10 and the edge of display substrate, and the second direction b intersects with the first direction a. For example, the second direction b is perpendicular to the first direction a.

As shown in FIG. 3, an orthographic projection of the first power connection line 33 on the base substrate is not overlapped with an orthographic projection of the pattern block B on the base substrate.

In this embodiment, this ensures that the edge portion may form the above pattern block B, thereby ensuring the uniformity of patterns in the display region.

As shown in FIG. 3, the display substrate further includes at least one second power connection line 34 extending in the second direction b. The plurality of first power connection lines 33 are at least partially overlapped with and is electrically connected to the at least one second power connection line 34. The second power connection line 34 is in the non-display region 20.

As shown in FIG. 3, an orthographic projection of the second power connection line 34 on the base substrate is not overlapped with the orthographic projection of the pattern block B on the base substrate.

In this embodiment, by disposing the second power connection line 34, an overlapping area of the VDD line and the VSS line can be increased effectively, that is, an overlapping area of the capacitor is increased, and the VDD stability is improved; and further, the power lines of the display substrate are cross-connected by the second power connection line 34 to connect the power lines of each column of sub-pixels together and interweave them into a mesh, and form a capacitor with the VSS, such that the signal uniformity of the power lines of the various portions is improved. Therefore, this solution can improve the brightness uniformity of the display panel.

In the embodiment of the present disclosure, the number of the second power connection line 34 may be one or plural. FIG. 3 shows one second power connection line 34, which facilitates design and manufacturing.

As shown in FIG. 3, the number of second power connection lines 34 is one and a width of the second power connection line 34 in the first direction a maybe ⅓~½ of a distance W between the sub-pixel and the dummy sub-pixel which are closest to the second power connection line. By designing the width of the second power connection line 34 in this way, on the one hand, it is ensured that the overlapping area of the capacitor is as large as possible and on the other hand, the situation that the second power connection line 34 is too close to the sub-pixel to affect the operation of sub-pixel is avoided.

Exemplarily, the width of the second power connection line 34 may range from 20 microns to 30 microns.

In the embodiment of the present disclosure, the second power connection line 34 and the power line 31 are on the same layer, and the second power connection line 34 is on the dummy source-drain (SD) layer. As such, the second power connection line 34 and the power line 31 may be manufactured together, and are connected to each other without an additional process.

Figure 4:
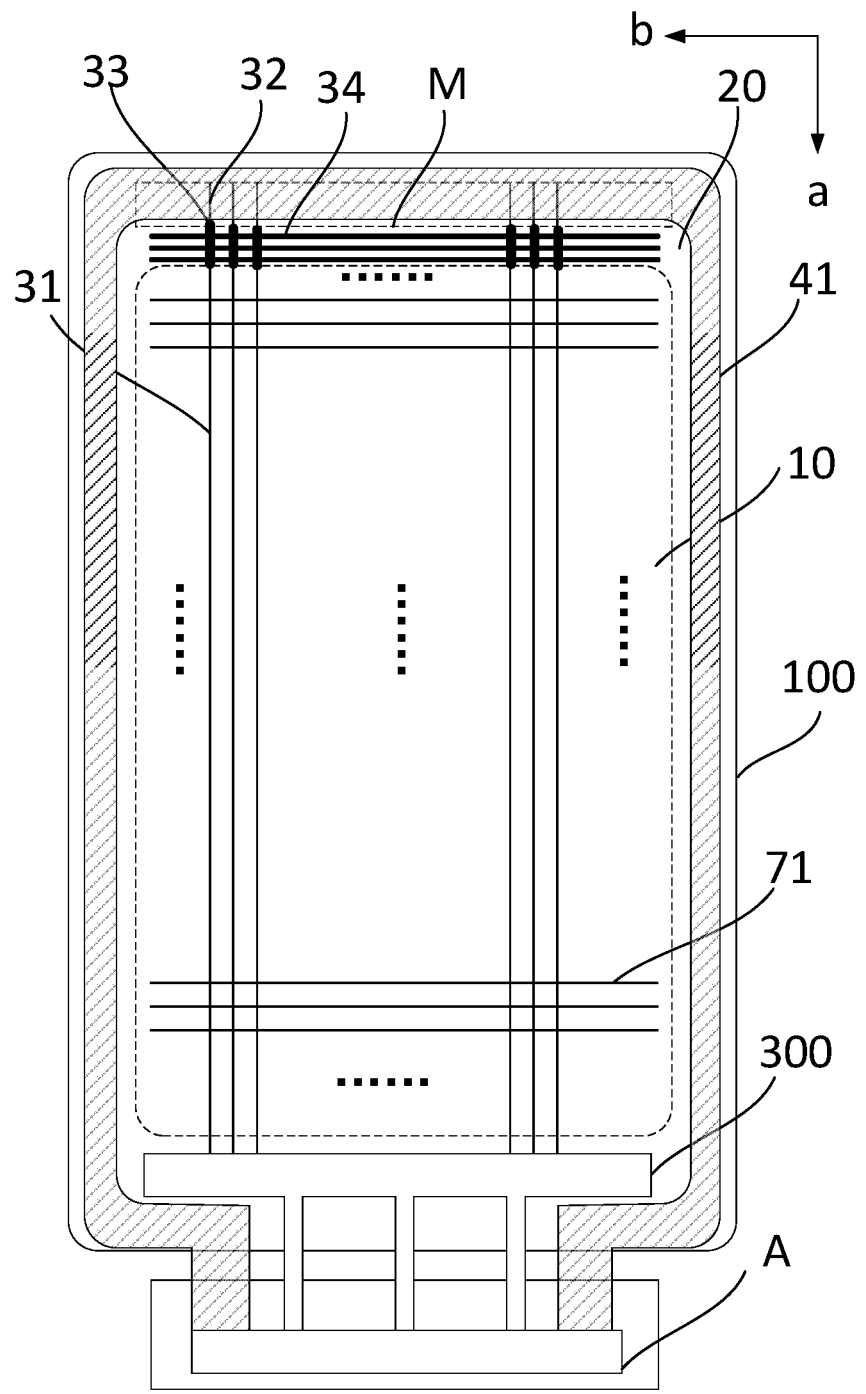
FIG. 4 is a structural diagram of another display substrate according to an embodiment of the present disclosure.

FIG. 4 is a structural diagram of another display substrate according to an embodiment of the present disclosure. With reference to FIG. 4, in this display substrate, the number of the second power connection lines 34 is plural and a plurality of second power connection lines 34 are disposed in parallel at intervals.

Figure 5:
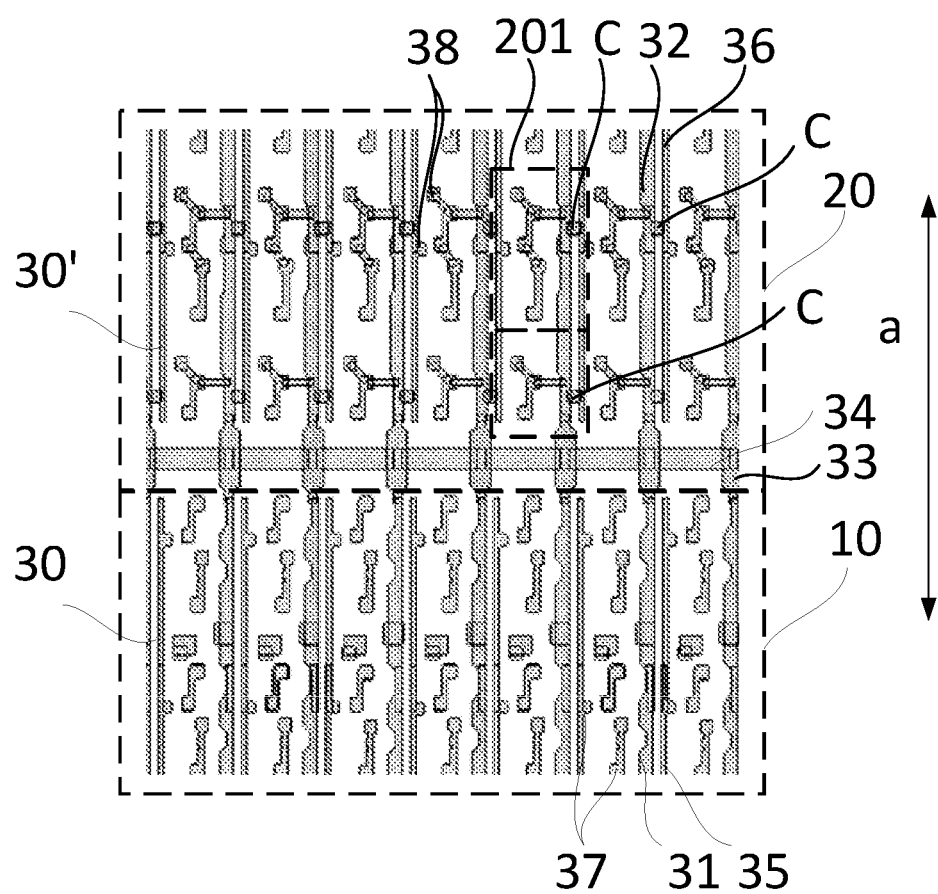
FIG. 5 is a structural diagram of an SD layer and a dummy SD layer according to an embodiment of the present disclosure.

FIG. 5 is a structural diagram of the SD layer and the dummy SD layer according to the embodiment of the present disclosure. With reference to FIG. 5, the display region is the SD layer 30 and the non-display region is the dummy SD layer 30'. The power line 31 in the display region 10 is connected to the corresponding dummy power line 32 in the non-display region 20 to form a power line extending from the display region 10 to the non-display region 20. The expression "corresponding" here refers to the power line 31 and the dummy power line 32 in the same column of pixels.

As shown in FIG. 5, a width of the first power connection line 33 for connecting the power line 31 and the dummy power line 32 in the non-display region 20 is greater than widths of the power line 31 and the dummy power line 32, where the width here refers to a width in the second direction b.

On the SD layer and the dummy SD layer, in addition to the power lines (the power line 31 and the dummy power line 32) and the power connection lines (the first power connection line 33 and the second power connection line 34), the SD layer and the dummy SD layer further include data lines (a data line 35 in the display region and a dummy data line 36 in the non-display region) and electrodes (an electrode 37 in the display region and a dummy electrode 38 in the non-display region).

As shown in FIG. 5, the display substrate further includes a plurality of dummy data lines 36 in the non-display region 20, wherein the plurality of dummy lines 36 extend along the first direction a, and are electrically connected to the plurality of dummy power lines 32.

As shown in FIG. 5, the plurality of dummy data lines 36 and the plurality of dummy power lines 32 are electrically connected in one-to-one correspondence. Exemplarily, the dummy power line 32 is electrically connected to the dummy data line 36 closest thereto.

In this embodiment, by connecting the dummy power line 32 and the dummy data line 36, when the dummy power line 32 and the VSS form the capacitor, the overlapping area of the capacitor with the VSS is increased and the capacity of the capacitor is increased, thereby improving the stability of the power line 31.

As shown in FIG. 5, one of the dummy data lines 36 and one of the dummy power lines 32 are electrically connected by a plurality of electrical contacts C, and the plurality of electrical contacts C is in one-to-one correspondence with a plurality of dummy sub-pixels 201 of one column of dummy sub-pixels 201. As shown in FIG. 5, a dashed box 201 corresponds to the dummy sub-pixel 201, and the dummy sub-pixel 201 corresponds to the electrical contact C.

As shown in FIG. 5, in the non-display region 20, the dummy electrode 38 is electrically connected to the power line 31. This further increases the overlapping area of the capacitor and improves the stability of the power line 31.

The SD layer includes the power line 31 and the data line 35, and the above gate line 71 is on the other layer, such as a first gate layer.

The display substrate according to the embodiment of the present disclosure may be an OLED display substrate. In the OLED display substrate, at least one of a plurality of sub-pixels includes a pixel circuit and a light-emitting element. The pixel circuit is between the base substrate and the light-emitting element. The light-emitting element includes a first electrode, an organic light-emitting layer and a second electrode which are staked sequentially. The second electrode is on a side of the organic light-emitting layer towards the base substrate. The second electrode may be an anode and the first electrode may be a cathode. The pixel circuit includes at least one thin-film transistor. The transistor includes an active layer on the base substrate, a gate layer on a side of the active layer distal from the base substrate, and a source-drain layer on a side of the gate layer distal from the base substrate.

Figure 6:
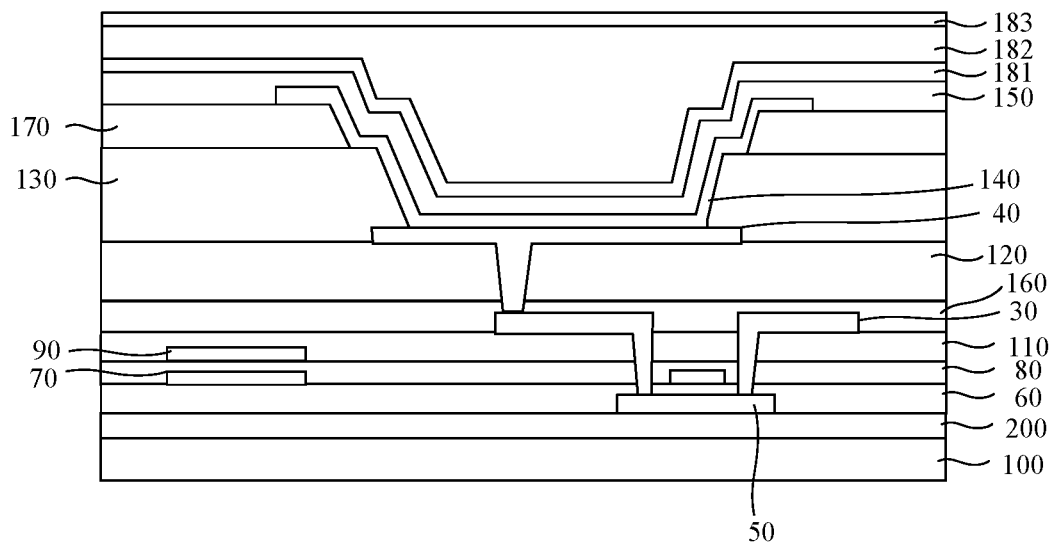
FIG. 6 is a sectional view of an OLED display substrate according to an embodiment of the present disclosure.

The following further describes the structure of the OLED display substrate with reference to FIG. 6.

FIG. 6 is a sectional view of an OLED display substrate according to an embodiment of the present disclosure. This sectional view is a sectional view in a direction F-F' in FIG. 1. With reference to FIG. 6, the OLED display substrate includes a base substrate 100, and a buffer layer 200, an active layer 50, a first gate insulation (GI) layer 60, a first gate layer 70, a second gate insulation layer 80, a second gate layer 90, an interlayer insulation layer 110, a source-drain layer 30, a planarization (PLN) layer 120, an anode layer 40, a pixel definition layer (PDL) 130, an organic light-emitting layer 140 and a cathode layer 150 which are stacked on the base substrate 100.

In the embodiment of the present disclosure, the above VSS line 41 is on the anode layer 40.

In this OLED display substrate, the second gate insulation layer 80 is between the first gate layer 70 and the second gate layer 90. The second gate layer 90 and the first gate layer 70 are separated by the second gate insulation layer 80 to ensure that the second gate layer 90 and the first gate layer 70 are separated from each other and may transmit signals independently. The interlayer insulation layer 110 is between the second gate layer 90 and the source-drain layer 30 to ensure independent signal transmission between the second gate layer 90 and the source-drain layer 30. The planarization layer 120 is between the source-drain layer 30 and the anode layer 40 to ensure that the source-drain layer 30 may transmit signals independently.

Exemplarily, the base substrate 100 may be a glass substrate. The active layer 50 may be a low temperature poly-silicon (LTPS) layer, also known as poly-Si or P-si layer. The buffer layer 200, the first gate insulation layer 60, the second gate insulation layer 80, and the interlayer insulation layer 110 may be insulation layers formed by one of silicon oxide, silicon nitride and silicon oxynitride or stacked layers formed by at least two of silicon oxide, silicon nitride and silicon oxynitride. The planarization layer 120 may be a resin layer or a planarization layer formed by one of silicon oxide, silicon nitride and silicon oxynitride or a stacked layer formed by at least two of silicon oxide, silicon nitride and silicon oxynitride. The first gate layer 70, the second gate layer 90, and the source-drain layer 30 may be metal layers or indium tin oxide layers. The anode layer 40 may be a metal layer or an indium tin oxide (ITO) layer. The cathode layer 150 may be an indium tin oxide layer or a magnesium-silver alloy layer. The organic light-emitting layer 140 may include a hole transport layer, a light-emitting layer and an electron transport layer which are stacked.

Optionally, with reference to FIG. 6, the OLED display substrate may also include a protective layer (PVX) layer 160 between the source-drain layer 30 and the planarization layer 120, a spacer (PS) layer 170 between the pixel definition layer 130 and the organic light-emitting layer 140, and an encapsulation layer covering the cathode layer 150. The encapsulation layer may be achieved by stacking a first inorganic encapsulation layer 181, an organic encapsulation layer 182 and a second inorganic encapsulation layer 183.

Figure 7:
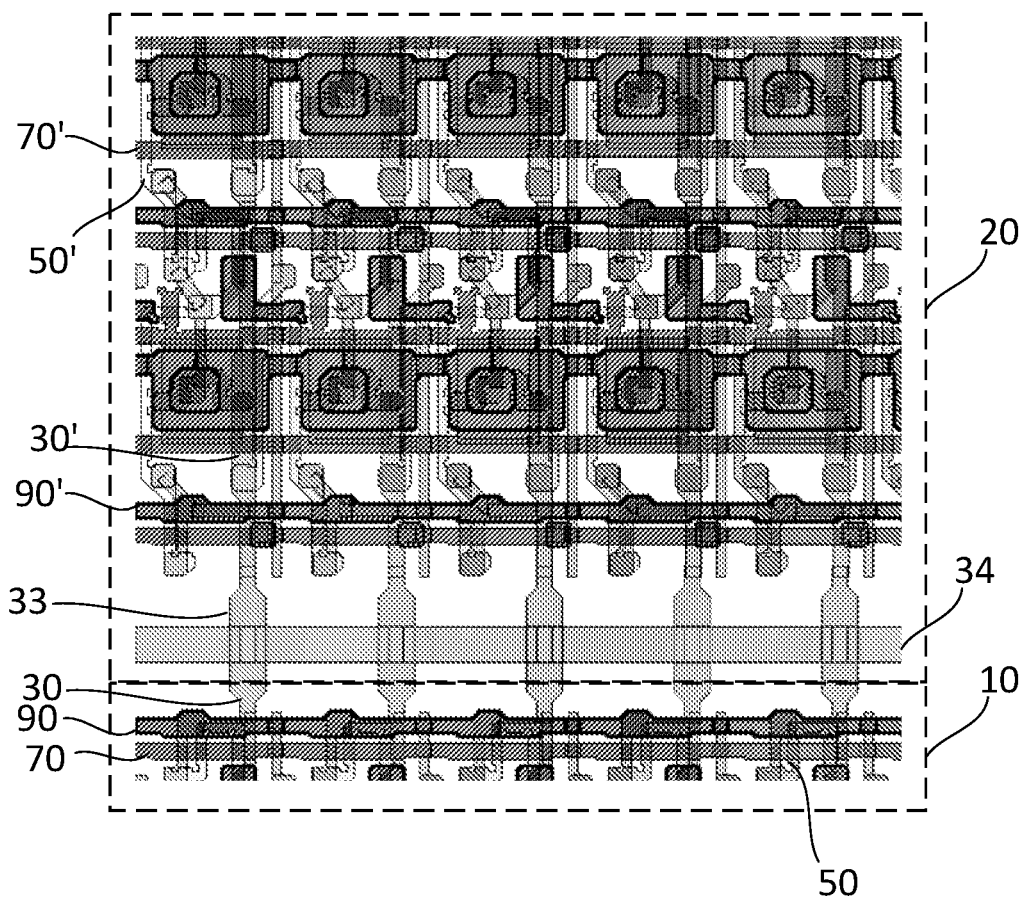
FIG. 7 is a diagram showing overlapping of part of film layer structures in the OLED display substrate according to an embodiment of the present disclosure.

FIG. 7 is a diagram showing overlapping of part of film layer structures in the OLED display substrate according to an embodiment of the present disclosure. With reference to FIG. 7, the display region mainly includes the active layer 50, the first gate layer 70, the second gate layer 90 and the source-drain layer 30. The non-display region mainly includes a dummy active layer 50', a first dummy gate layer 70', a second dummy gate layer 90' and a dummy source-drain layer 30'. The following describes the structures of the active layer 50 (the dummy active layer 50'), the first gate layer 70 (the first dummy gate layer 70'), and the second gate layer 90 (the second dummy gate layer 90') in FIG. 7 with reference to FIGS. 8-10.

Figure 8:
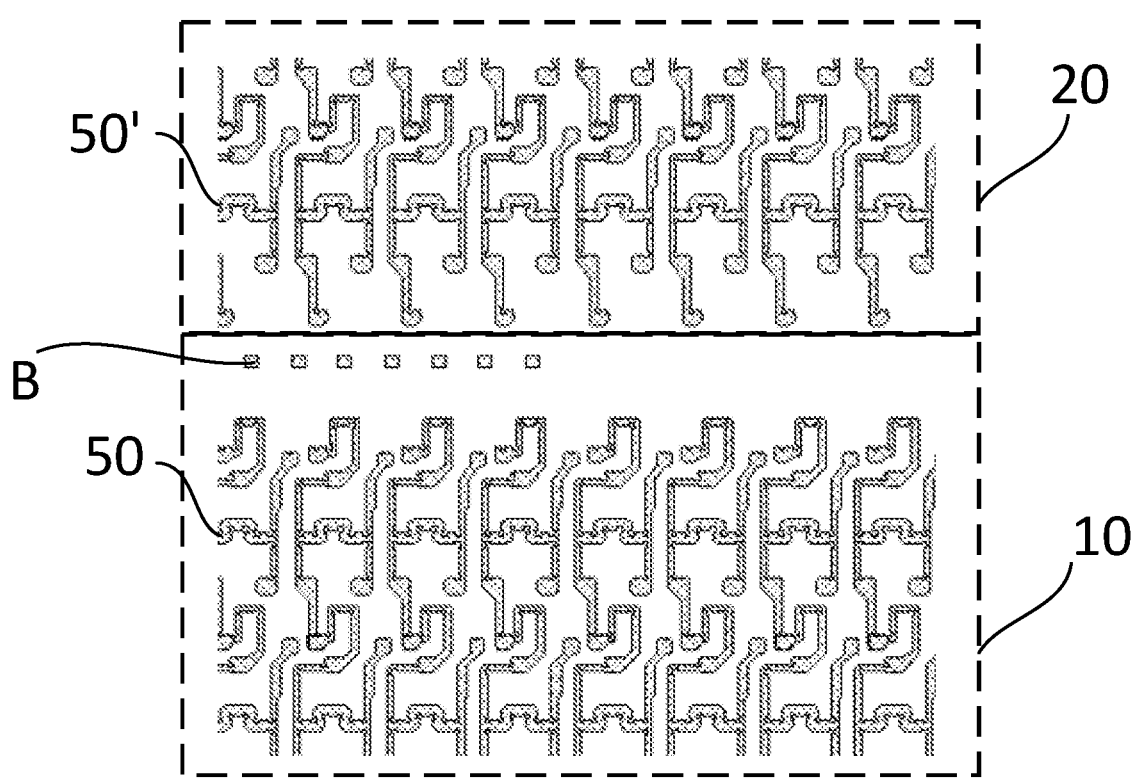
FIG. 8 is a structural diagram of an active layer and a dummy active layer according to an embodiment of the present disclosure.

FIG. 8 is a structural diagram of the active layer 50 and the dummy active layer 50' shown according to an embodiment of the present disclosure. With reference to FIG. 8, the active layer 50 in the display region 10 and the dummy active layer 50' in the non-display region 20 have the same major structure, only except that the dummy active layer 50' in the non-display region 20 may include the pattern block B.

Figure 9:
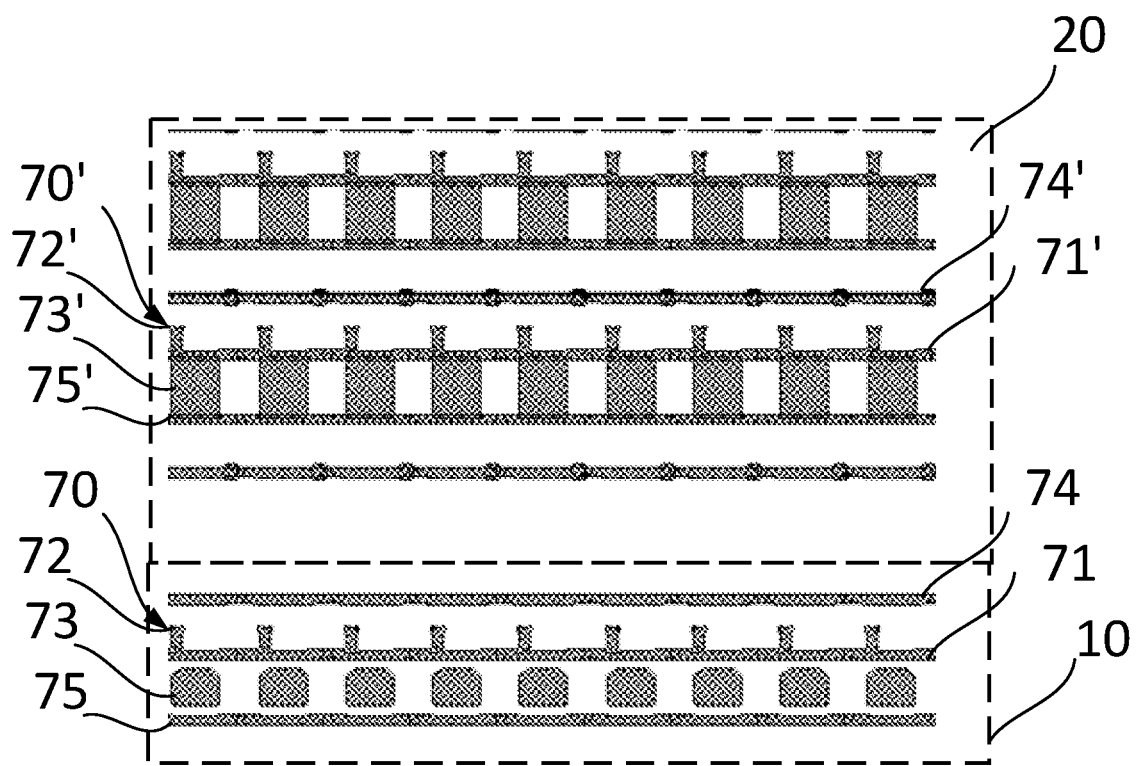
FIG. 9 is a structural diagram of a first gate layer and a first dummy gate layer shown according to an embodiment of the present disclosure.

FIG. 9 is a structural diagram of the first gate layer 70 and the first dummy gate layer 70' shown according to an embodiment of the present disclosure. With reference to FIG. 9, the first gate layer 70 in the display region 10 may include a gate line 71, a gate 72, a first capacitor plate 73, a first signal line 74 and a second signal line 75. The dummy first gate layer 70' in the non-display region 20 may include a dummy gate line 71', a dummy gate 72', a first dummy capacitor plate 73', a first dummy signal line 74' and a second dummy signal line 75'.

In the display region 10, in the same line of pixels, only the gate line 71 and the gate 72 are connected. In the non-display region 20, in the same line of pixels, the dummy gate line 71', the dummy gate 72', the first dummy capacitor plate 73' and the second dummy signal line 75' may all be connected together, such that a line of dummy sub-pixels may be connected together. After connection with the dummy power line, the overlapping capacitor formed with the VSS can be increased. In addition to the connection mode shown in FIG. 9, in other embodiments, in addition to connecting the dummy gate 72', the dummy gate line 71' may be connected to only one, any two or three of the first dummy capacitor plate 73', the first dummy signal line 74' and the second dummy signal line 75'.

In the OLED display substrate, the pixel circuit is usually a circuit with a plurality of thin film transistors (T)+a capacitor, such as 7T1C or 6T1C. In the circuit such as 7T1C, in addition to providing a GATE signal, a VDD signal, a DATA signal and the like, it also needs to provide a RESET signal, a REF (reference) signal, a VINT (initial) signal, an EM (light emission control) signal and other voltage signals. The above first signal line 74 and the second signal line 75 may be configured to provide at least one of the above voltage signals. For example, the first signal line 74 is a RESET signal line and the second signal line 75 is an EM (light emission control) signal line.

Figure 10:
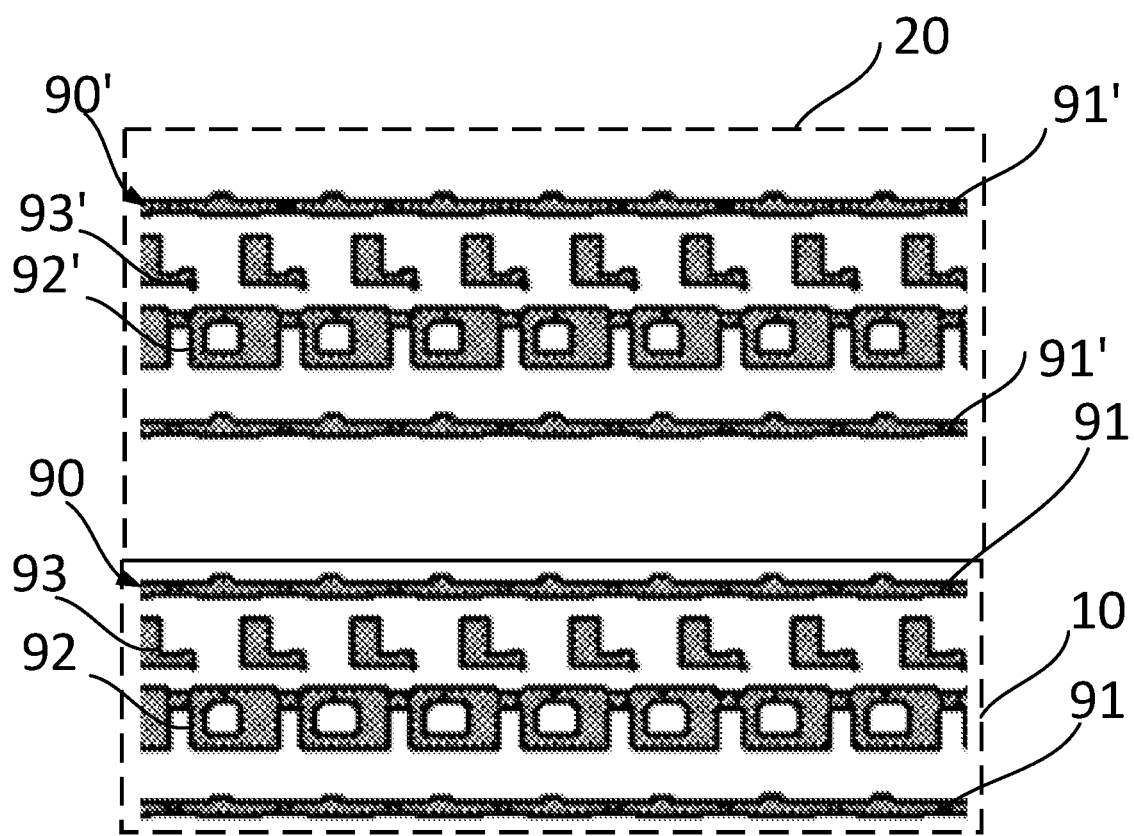
FIG. 10 is a structural diagram of a second gate layer and a second dummy gate layer shown according to an embodiment of the present disclosure.

FIG. 10 is a structural diagram of the second gate layer 90 and the second dummy gate layer 90' shown according to the embodiment of the present disclosure. With reference to FIG. 10, the second gate layer 90 in the display region 10 and the second dummy gate layer 90' in the non-display region 20 have the same structure. The second gate layer 90 includes a third signal line 91, a second capacitor plate 92 and a shielding layer 93. The dummy second gate layer 90' includes a third dummy signal line 91', a second dummy capacitor plate 92' and a dummy shielding layer 93'. The first capacitor plate 73 and the second capacitor plate 92 together form a storage capacitor (Cst), which may be a capacitor C in the circuit such as 7T1C. The shielding layer 93 may be configured to shield the active layer 50 to prevent current leakage, and a capacitor is formed between the shielding layer and the active layer 50. The capacitor may be configured to stabilize certain thin film transistor in the circuit 7T1C. The third signal line 91 may be configured to provide voltage signals such as the RESET signal, the REF signal, and the VINT signal. For example, the third signal line 91 is a VINT signal line.

In the embodiment of the present disclosure, the dummy sub-pixel includes the first dummy gate layer 70', the dummy active layer 50' and the second dummy gate layer 90', and the dummy power line 32 is further electrically connected to at least one of the first dummy gate layer 70', the dummy active layer 50' and the second dummy gate layer 90'. As such, the overlapping capacitor formed by the dummy power line 32 and the VSS can be increased.

Figure 11:
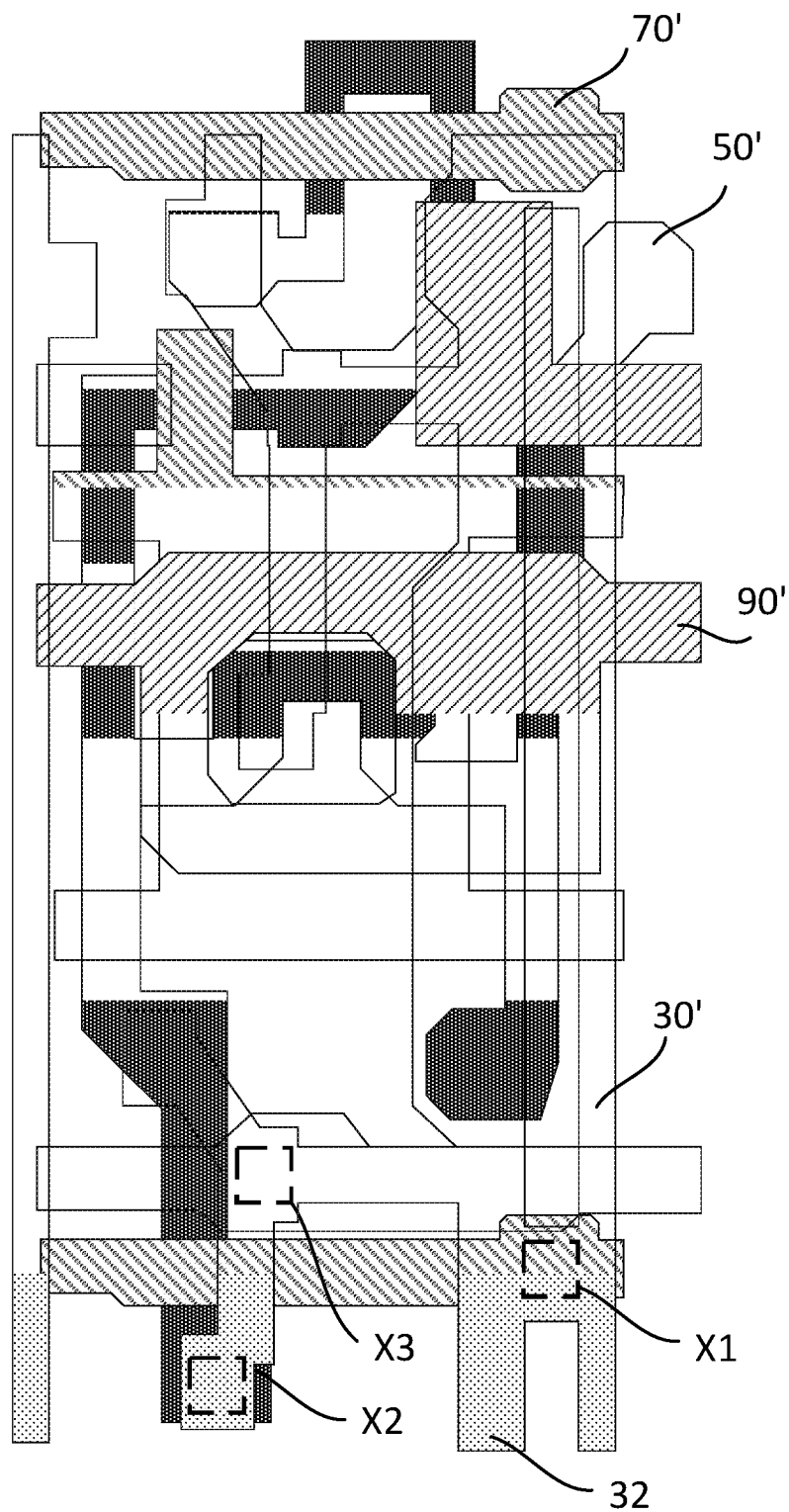
FIG. 11 is a diagram showing overlapping of part of film layer structures in a dummy sub-pixel in the OLED display substrate according to an embodiment of the present disclosure.

FIG. 11 is a diagram showing overlapping of part of film layer structures in the dummy sub-pixel in the OLED display substrate according to an embodiment of the present disclosure. The dummy active layer 50', the first dummy gate layer 70', the second dummy gate layer 90' and the dummy source-drain layer 30' are mainly included. In the structure shown in FIG. 11, the dummy power line 32 is electrically connected to the first dummy gate layer 70', the dummy active layer 50', and the second dummy gate layer 90'.

Figure 12:
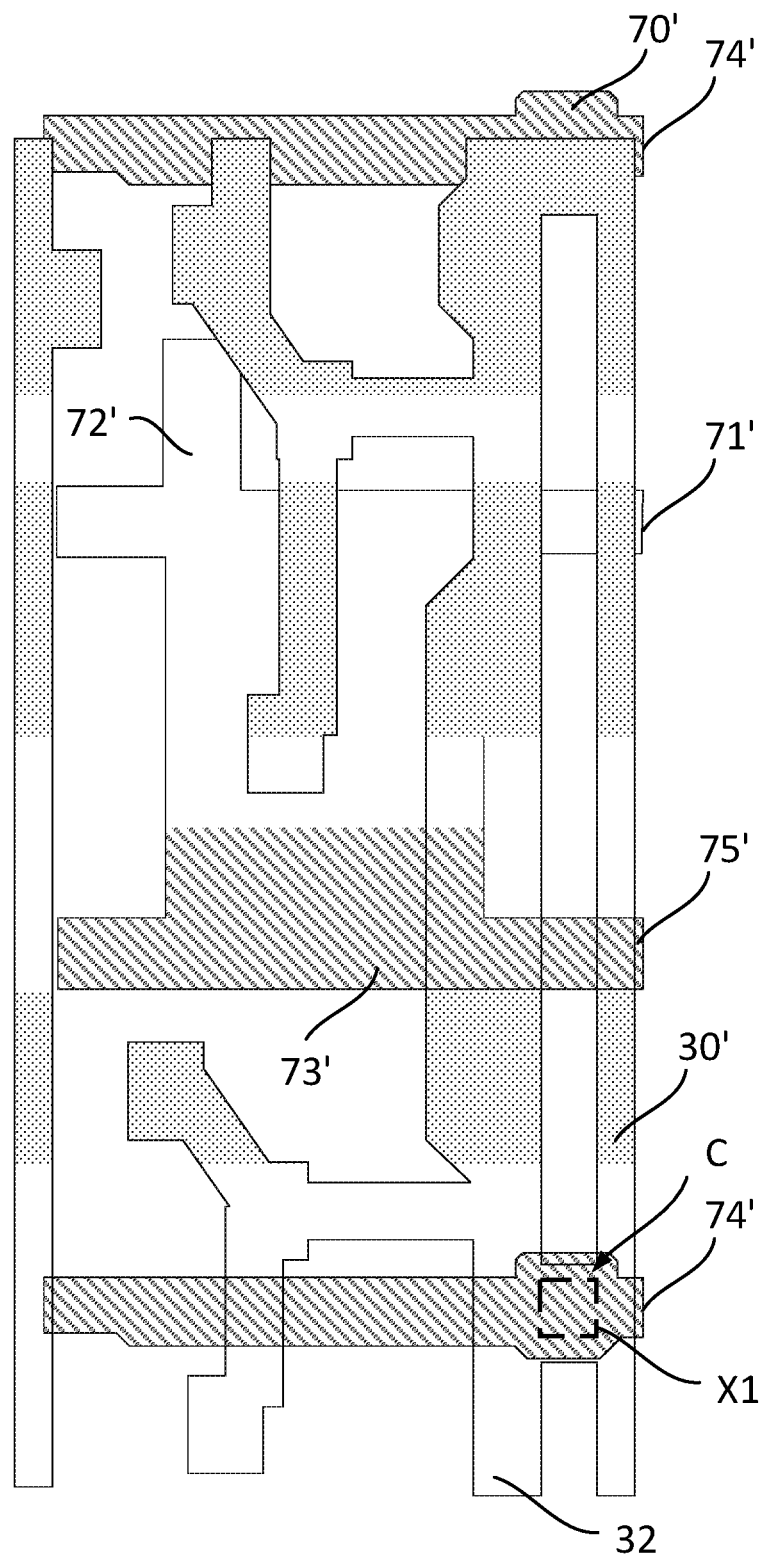
FIG. 12 is a diagram showing overlapping of the first dummy gate layer and a dummy source-drain layer according to an embodiment of the present disclosure.

FIG. 12 is a diagram showing overlapping of the first dummy gate layer 70' and the dummy source-drain layer 30' according to an embodiment of the present disclosure. With reference to FIGS. 11 and 12, the dummy power line 32 is electrically connected to the first dummy gate layer 70'.

Exemplarily, a first via X1 is disposed at the electrical contact C and the dummy power line 32 is electrically connected to the first dummy gate layer 70' by the first via X1.

For example, the dummy sub-pixel further includes a first dummy gate insulation layer, a second dummy gate insulation layer, and a dummy interlayer insulation layer. The first dummy gate insulation layer is between the dummy active layer 50' and the first dummy gate layer 70', the second dummy gate insulation layer is between the first dummy gate layer 70' and the second dummy gate layer 90', and the dummy interlayer insulation layer is between the second dummy gate layer 90' and the dummy power line 32. The first dummy gate insulation layer and the first gate insulation layer 60 are on the same layer, the second dummy gate insulation layer and the second gate insulation layer 80 are on the same layer, and the dummy interlayer insulation layer and the interlayer insulation layer 110 are on the same layer.

Here, the first via X1 being disposed at the electrical contact C means that the first via is formed in the second dummy gate insulation layer and the dummy interlayer insulation layer which are below the electrical contact C. This first via may achieve the electrical connection between the electrical contact C and the first dummy gate layer 70'.

As shown in FIG. 12, the dummy power line 32 is electrically connected to the first dummy signal line 74' of the first dummy gate layer 70' by the first via X1.

Figure 13:
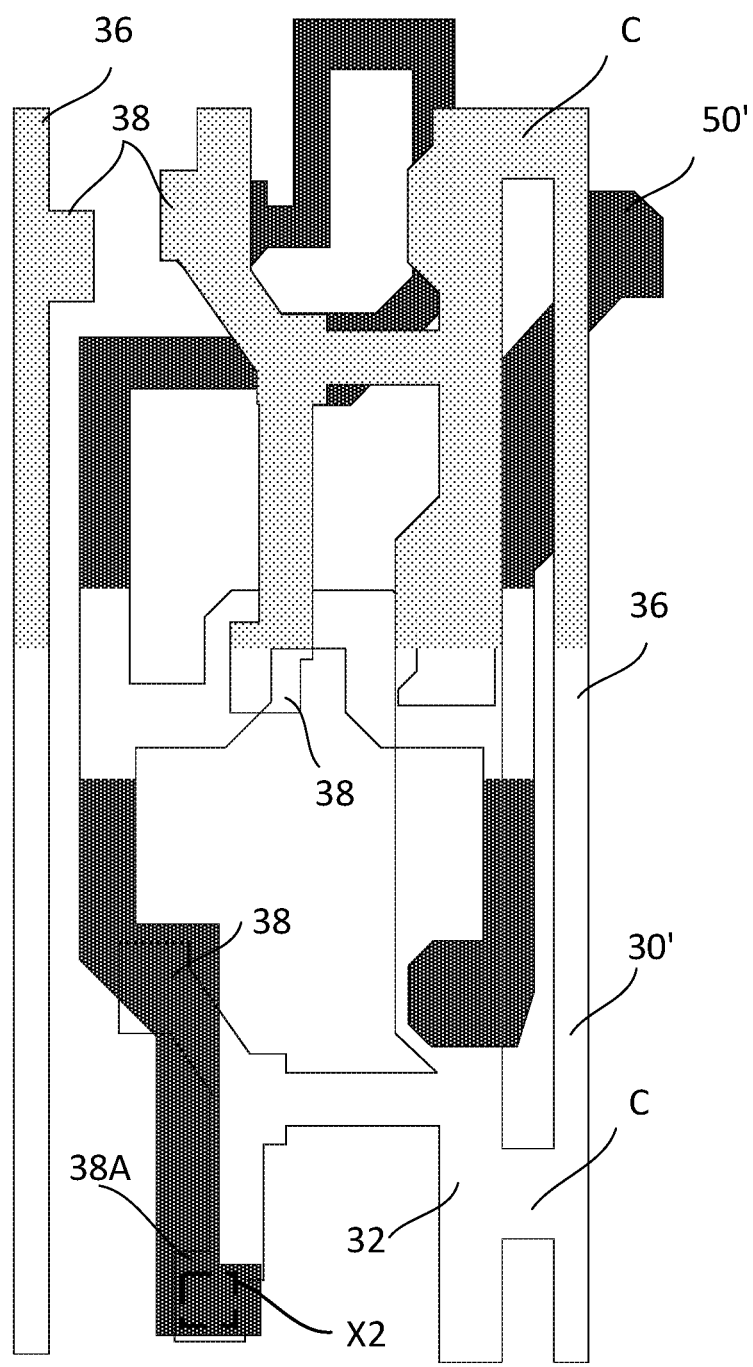
FIG. 13 is a diagram showing overlapping of the dummy active layer and the dummy source-drain layer according to an embodiment of the present disclosure.

FIG. 13 is a diagram showing overlapping of the dummy active layer 50' and the dummy source-drain layer 30' according to an embodiment of the present disclosure. With reference to FIGS. 11 and 13, the dummy power line 32 is electrically connected to the dummy active layer 50'.

The dummy source-drain layer of the display substrate 30' includes a plurality of dummy electrodes 38 electrically connected to the dummy power line 32.

Exemplarily, the dummy electrode 38 includes a first dummy electrode 38A. A second via X2 is disposed at the first dummy electrode 38A, and the dummy power line 32 is electrically connected to the dummy active layer 50' by the second via X2. Here, the second via X2 being disposed at the first dummy electrode 38A means that the second via is formed in the first dummy gate insulation layer, the second dummy gate insulation layer and the dummy interlayer insulation layer which are below the first dummy electrode 38A. This second via may achieve the electrical connection between the first dummy electrode 38A and the dummy active layer 50'.

As shown in FIG. 13, the lowest dummy electrode 38 is the above first dummy electrode 38A. In other embodiments, the first dummy electrode 38A may be another dummy electrode 38.

Figure 14:
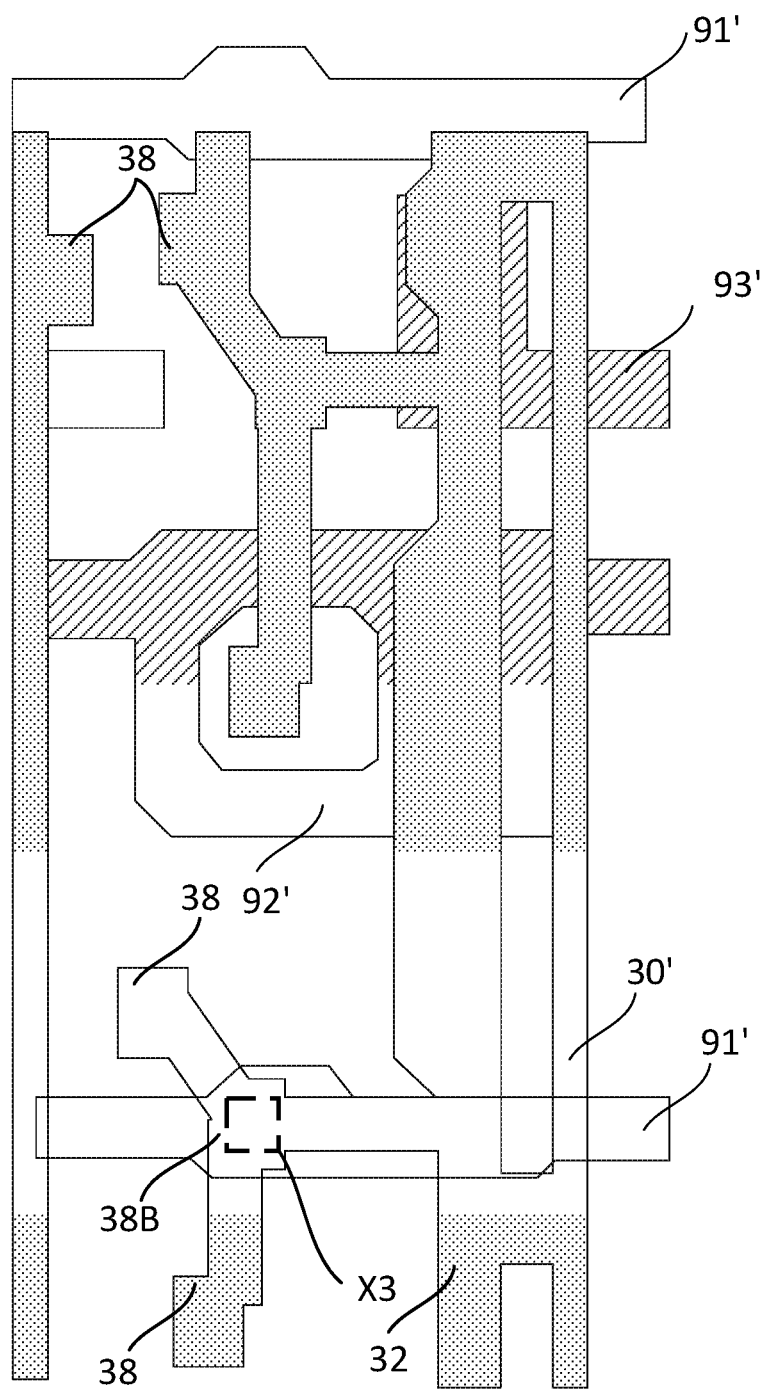
FIG. 14 is a diagram showing overlapping of the second dummy gate layer and the dummy source-drain layer according to an embodiment of the present disclosure.

FIG. 14 is a diagram showing the overlapping of the second dummy gate layer 90' and the dummy source-drain layer 30' according to the embodiment of the present disclosure. With reference to FIGS. 11 and 14, the dummy power line 32 is electrically connected to the second dummy gate layer 90'.

Exemplarily, the dummy electrode 38 includes a second dummy electrode 38B. A third via X3 is disposed at the second dummy electrode 38B, and the dummy power line 32 is electrically connected to the second dummy gate layer 90' by the third via X3. The second dummy electrode 38B and the first dummy electrode 38A are different dummy electrodes. Here, the third via X3 being disposed at the second dummy electrode 38B means that the third via is formed in the dummy interlayer insulation layer below the second dummy electrode 38B. This third via may achieve the electrical connection between the second dummy electrode 38B and the second dummy gate layer 90'.

As shown in FIG. 14, a dummy electrode adjacent to the first dummy electrode 38A is the second dummy electrode 38B. In other embodiments, the second dummy electrode 38B may be another dummy electrode.

As shown in FIG. 14, the dummy power line 32 is electrically connected to the third dummy signal line 91' of the second dummy gate layer 90' by the third via X3.

The present disclosure provides a display device. The display device includes the display substrate shown in any of the above figures.

In practice, the display device according to the embodiment of the present disclosure may be any product or component having a display function such as a mobile phone, a tablet computer, a television, a display, a laptop computer, a digital photo frame, and a navigator.

The capacitor may be formed between the dummy power line of the dummy sub-pixel in the non-display region and the common power line. In the related art, the gate high-level signal is input into the dummy power line in the non-display region. This solution shows no contribution to the display of the display region. In the embodiment of the present disclosure, by connecting the power line in the display region to the dummy power line in the non-display region, the capacitor can compensate for the jump of the power line in the display region and increase the stability of the power line in the display region. Therefore, this solution can improve the brightness stability of the display panel.

Described above are only example embodiments of the present disclosure, and are not intended to limit the present disclosure. Any modifications, equivalent replacements, improvements and the like made within the spirit and principles of the present disclosure should be included within the scope of protection of the present disclosure.

What is claimed is:

1. A display substrate, comprising:
   a base substrate comprising a display region and a non-display region surrounding the display region;
   a plurality of sub-pixels in the display region;
   a plurality of power lines in the display region, the plurality of power lines extending along a first direction, and being electrically connected to the plurality of sub-pixels and being configured to provide power signals for the plurality of sub-pixels;
   a plurality of dummy sub-pixels in the non-display region on one side of the display region along the first direction; and
   a plurality of dummy power lines in the non-display region, the plurality of dummy power lines extending along the first direction, the plurality of dummy power lines and the plurality of dummy sub-pixels being on the same side of the display region, and at least part of the plurality of power lines being electrically connected to at least part of the plurality of dummy power lines in one-to-one correspondence;
   the display substrate further comprises a plurality of first power connection lines in the non-display region, wherein the plurality of first power connection lines are disposed between the plurality of power lines and the plurality of dummy power lines and extend along the first direction, and the plurality of first power connection lines are connected to the plurality of power lines and the plurality of dummy power lines in one-to-one correspondence; and
   the display substrate further comprises at least one second power connection line extending in a second direction, wherein the first direction intersects with the second direction, and the plurality of first power connection lines are at least partially overlapped with and are electrically connected to the at least one second power connection line.

2. The display substrate according to claim 1, wherein the number of the at least one second power connection line is one, or the number of the at least one second power connection line is plural and the plurality of second power connection lines is parallel to each other.

3. The display substrate according to claim 2, wherein the display substrate comprises one second power connection line, and a width of the second power connection line ranges from 20 microns to 30 microns in a direction perpendicular to the second direction.

4. The display substrate according to claim 1, further comprising a plurality of pattern blocks in the non-display region, wherein the plurality of pattern blocks are spaced apart from each other around the display region.

5. The display substrate according to claim 4, wherein orthographic projections of the first power connection line and the second power connection line on the base substrate are not overlapped with an orthographic projection of the pattern block on the base substrate.

6. The display substrate according to claim 4, wherein the plurality of sub-pixels comprise an active layer on the base substrate, a gate layer on a side of the active layer distal from the base substrate, and a source-drain layer on a side of the gate layer distal from the base substrate;
   wherein the plurality of pattern blocks are on the same layer as the active layer.

7. The display substrate according to claim 1, further comprising a plurality of dummy data lines in the non-display region, wherein the plurality of dummy data lines extend along the first direction, and are electrically connected to the plurality of dummy power lines.

8. The display substrate according to claim 7, wherein the plurality of dummy data lines and the plurality of dummy power lines are electrically connected in one-to-one correspondence.

9. The display substrate according to claim 8, wherein one of the dummy data lines and one of the dummy power lines are electrically connected by a plurality of electrical contacts, wherein the plurality of electrical contacts are in one-to-one correspondence with the plurality of dummy sub-pixels.

10. The display substrate according to claim 9, wherein the dummy sub-pixel comprises a dummy active layer on the base substrate, a first dummy gate layer on a side of the dummy active layer distal from the base substrate, and a second dummy gate layer on a side of the first dummy gate layer distal from the base substrate, wherein the dummy power line is on a side of the second dummy gate layer distal from the base substrate; and the dummy power line is electrically connected to at least one of the dummy active layer, the first dummy gate layer, and the second dummy gate layer.

11. The display substrate according to claim 10, wherein the dummy sub-pixel further comprises a first dummy gate insulation layer, a second dummy gate insulation layer, and a dummy interlayer insulation layer, wherein the first dummy gate insulation layer is between the dummy active layer and the first dummy gate layer, the second dummy gate insulation layer is between the first dummy gate layer and the second dummy gate layer, and the dummy interlayer insulation layer is between the second dummy gate layer and the dummy power line.

12. The display substrate according to claim 11, wherein the dummy sub-pixel further comprises one kind of following vias:
a first via running through the second dummy gate insulation layer and the dummy interlayer insulation layer, and the dummy power line is electrically connected to the first dummy gate layer by the first via;
a second via running through the first dummy gate insulation layer, the second dummy gate insulation layer, and the dummy interlayer insulation layer, and the dummy power line is electrically connected to the dummy active layer by the second via; or
a third via running through the dummy interlayer insulation layer, and the dummy power line is electrically connected to the second dummy gate layer by the third via.

13. The display substrate according to claim 12, wherein the dummy sub-pixel further comprises a first dummy electrode, wherein the first dummy electrode is electrically connected to the dummy power line, and is electrically connected to the dummy active layer by the second via.

14. The display substrate according to claim 12, wherein the dummy sub-pixel further comprises a second dummy electrode, wherein the second dummy electrode is electrically connected to the dummy power line, and is electrically connected to the second dummy gate layer by the third via.

15. The display substrate according to claim 1, further comprising a plurality of data lines in the display region, wherein the plurality of data lines extend along the first direction, and are insulated from the plurality of power lines.

16. The display substrate according to claim 1, further comprising a power bus in the non-display region and on a side, distal to the plurality of dummy sub-pixels, of the display region, wherein the plurality of power lines are electrically connected to a flexible printed circuit (FPC) by the power bus.

17. A display device, comprising a display substrate, wherein
the display substrate comprises:
a base substrate comprising a display region and a non-display region surrounding the display region;
a plurality of sub-pixels in the display region;
a plurality of power lines in the display region, the plurality of power lines extending along a first direction, and being electrically connected to the plurality of sub-pixels and being configured to provide power signals for the plurality of sub-pixels;
a plurality of dummy sub-pixels in the non-display region on one side of the display region along the first direction; and
a plurality of dummy power lines in the non-display region, the plurality of dummy power lines extending along the first direction, the plurality of dummy power lines and the plurality of dummy sub-pixels being on the same side of the display region, and at least part of the plurality of power lines being electrically connected to at least part of the plurality of dummy power lines in one-to-one correspondence;
the display substrate further comprises a plurality of first power connection lines in the non-display region, wherein the plurality of first power connection lines are disposed between the plurality of power lines and the plurality of dummy power lines and extend along the first direction, and the plurality of first power connection lines are connected to the plurality of power lines and the plurality of dummy power lines in one-to-one correspondence; and
the display substrate further comprises at least one second power connection line extending in a second direction, wherein the first direction intersects with the second direction, and the plurality of first power connection lines are at least partially overlapped with and are electrically connected to the at least one second power connection line.

* * * * *